United States Patent
Chen (10) Patent No.: US 12,154,641 B2
(45) Date of Patent: Nov. 26, 2024

(54) TESTING METHOD AND TESTING SYSTEM

(71) Applicant: NANYA TECHNOLOGY CORPORATION, New Taipei (TW)

(72) Inventor: Wei-Chun Chen, Changhua County (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 196 days.

(21) Appl. No.: 18/058,740

(22) Filed: Nov. 24, 2022

(65) Prior Publication Data

US 2024/0177790 A1    May 30, 2024

(51) Int. Cl.
G11C 29/12     (2006.01)
G11C 29/46     (2006.01)

(52) U.S. Cl.
CPC .... G11C 29/1201 (2013.01); G11C 29/12015 (2013.01); G11C 29/46 (2013.01)

(58) Field of Classification Search
CPC .......... G11C 29/1201; G11C 29/12015; G11C 29/46; G11C 29/028; G11C 29/023
USPC .................................. 365/193, 201
See application file for complete search history.

(56) References Cited

U.S. PATENT DOCUMENTS

| | | | |
|---|---|---|---|
| 10,187,062 B1 * | 1/2019 | Shimizu | G11C 29/028 |
| 10,418,125 B1 * | 9/2019 | Lin | G11C 11/4094 |
| 2003/0184343 A1 * | 10/2003 | Kuge | H03K 19/018592 |
| | | | 326/86 |
| 2004/0015807 A1 * | 1/2004 | Honjou | G01R 31/31723 |
| | | | 257/48 |
| 2004/0212422 A1 * | 10/2004 | Jung | G05F 1/465 |
| | | | 327/541 |
| 2007/0086250 A1 * | 4/2007 | Zimlich | G11C 7/22 |
| | | | 365/194 |
| 2013/0223140 A1 * | 8/2013 | Sohn | G11C 5/02 |
| | | | 365/158 |
| 2014/0362637 A1 * | 12/2014 | Jeong | G11C 8/08 |
| | | | 365/149 |
| 2015/0364173 A1 * | 12/2015 | Kim | G11C 7/1066 |
| | | | 365/194 |
| 2015/0378885 A1 * | 12/2015 | Kim | G06F 12/0246 |
| | | | 711/103 |
| 2016/0172013 A1 * | 6/2016 | Dearth | G06F 1/10 |
| | | | 711/106 |
| 2019/0065074 A1 * | 2/2019 | Lee | G11C 5/04 |
| 2019/0348094 A1 * | 11/2019 | Park | G06F 3/0634 |

FOREIGN PATENT DOCUMENTS

| | | | | |
|---|---|---|---|---|
| CN | 102637155 A | * | 8/2012 | |
| CN | 103065677 A | * | 4/2013 | |
| JP | 4519392 B2 | * | 8/2010 | ........... H01L 23/481 |
| JP | 2016099788 A | * | 5/2016 | |

* cited by examiner

*Primary Examiner* — Michael T Tran
(74) *Attorney, Agent, or Firm* — CKC & Partners Co., LLC (57) ABSTRACT

A testing method includes the following steps of: accessing a memory chip to put the memory chip into a write leveling mode; inputting a strobe signal into the memory chip under the write leveling mode; adjusting signal edges of the strobe signal to sample a clock state of a clock signal in the memory chip under the write leveling mode; generating a data signal according to the strobe signal under the write leveling mode; and determining types of the memory chip according to the data signal under the write leveling mode.

20 Claims, 6 Drawing Sheets

TESTING METHOD AND TESTING SYSTEM

BACKGROUND

Field of Invention

The present disclosure relates to a method and an electronic system. More particularly, the present disclosure relates to a testing method and a testing system.

Description of Related Art

Normally, memories are under a write leveling mode, a clock state of a clock signal is changed with a rising edge of data Q strobe (DQS) signals, and asynchronously feeds back to a memory controller.

Some of memories have opposite behavior that a clock state of a clock signal is changed with a falling edge of DQS signals. It is too difficult to investigate two kinds of memories so as to adjust a delay relationship between DQS signal and clock signals of a memory under a write leveling mode.

For the foregoing reason, there is a need to provide some testing method to solve the problems of the prior art.

SUMMARY

One aspect of the present disclosure provides a testing method. The testing method includes the following steps of: accessing a memory chip to put the memory chip into a write leveling mode; inputting a strobe signal into the memory chip under the write leveling mode; adjusting signal edges of the strobe signal to sample a clock state of a clock signal in the memory chip under the write leveling mode; generating a data signal according to the strobe signal under the write leveling mode; and determining types of the memory chip according to the data signal under the write leveling mode.

Another aspect of the present disclosure provides a testing system. The testing system includes a memory chip and a memory controller. The memory controller is coupled to the memory chip. The memory controller is configured to access the memory chip to put the memory chip into a write leveling mode. The memory controller is configured to input a strobe signal into the memory chip under the write leveling mode. The memory controller is configured to adjust signal edges of the strobe signal to sample a clock state of a clock signal in the memory chip under the write leveling mode. The memory chip is configured to generate a data signal according to the strobe signal under the write leveling mode. The memory controller is configured to determine types of the memory chip according to the data signal under the write leveling mode.

These and other aspects of the present disclosure will become apparent from the following description of the preferred embodiment taken in conjunction with the following drawings, although variations and modifications therein may be effected without departing from the spirit and scope of the novel concepts of the disclosure.

It is to be understood that both the foregoing general description and the following detailed description are by examples, and are intended to provide further explanation of the present disclosure as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
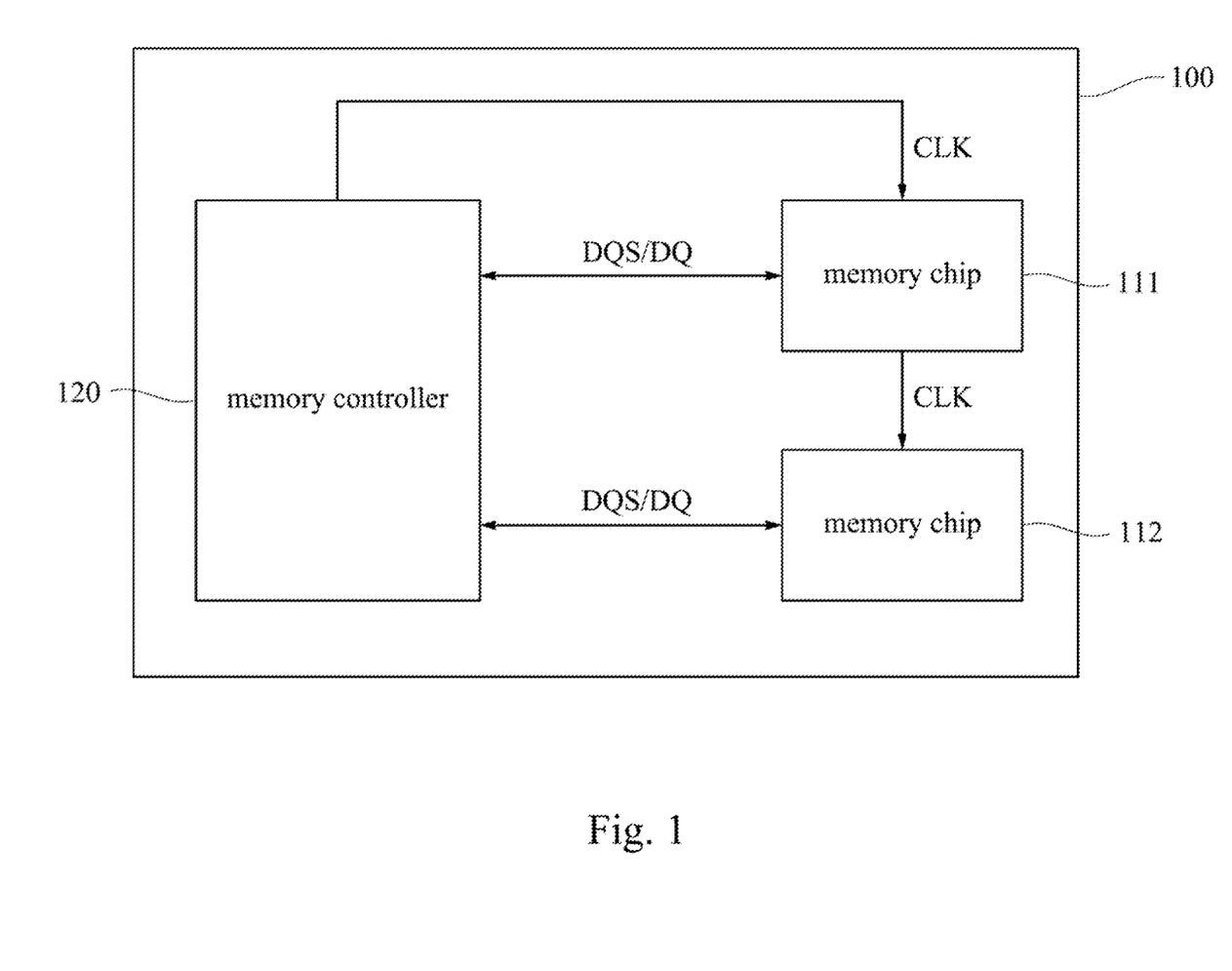
FIG. 1 depicts a schematic diagram of a testing system according to one embodiment of the present disclosure.

FIG. 1 depicts a schematic diagram of a testing system 100 according to one embodiment of the present disclosure. In some embodiments, please refer to FIG. 1, the testing system 100 includes a memory chip 111, a memory chip 112, and a memory controller 120. The memory chip 111 is coupled to the memory chip 112. The memory controller 120 is coupled to the memory chip 111 and the memory chip 112. It should be noted that a number of the memory chip 111 and the memory chip 112 can be changed according to actual needs, and are not limited to embodiments of FIG. 1. The following paragraphs are mainly explained with memory chip 111.

In some embodiments, the memory controller 120 is configured to access the memory chip 111 to put the memory chip into a write leveling mode. The memory controller 120 is configured to input a strobe signal DQS into the memory chip 111 under the write leveling mode.

Then, the memory controller 120 is configured to adjust signal edges of the strobe signal DQS to sample a clock state of a clock signal CLK in the memory chip 111 under the write leveling mode.

Furthermore, the memory chip 111 is configured to generate a data signal DQ according to the strobe signal DQS under the write leveling mode. The memory controller 120 is configured to determine types of the memory chip 111 according to the data signal DQ under the write leveling mode.

In some embodiments, the memory controller 120 is further configured to compensate the memory chip 111 according to the types of the memory chip 11 under the write leveling mode. In some embodiments, the memory controller 120 is further configured to adjust a delay of the strobe signal DQS relative to the clock signal CLK under the write leveling mode.

In some embodiments, each of the memory chip 111 and the memory chip 112 includes a synchronous dynamic random access memory (SDRAM). In some embodiments, each of the memory chip 111 and the memory chip 112 can be a double data rate (DDR) SDRAM. In some embodiments, each of the memory chip 111 and the memory chip 112 can be a DDR3 SDRAM to a DDR5 SDRAM, or next generations DDR SDRAM.

In some embodiments, each of the strobe signal DQS and the data signal DQ is a bidirectional signal.

Figure 2:
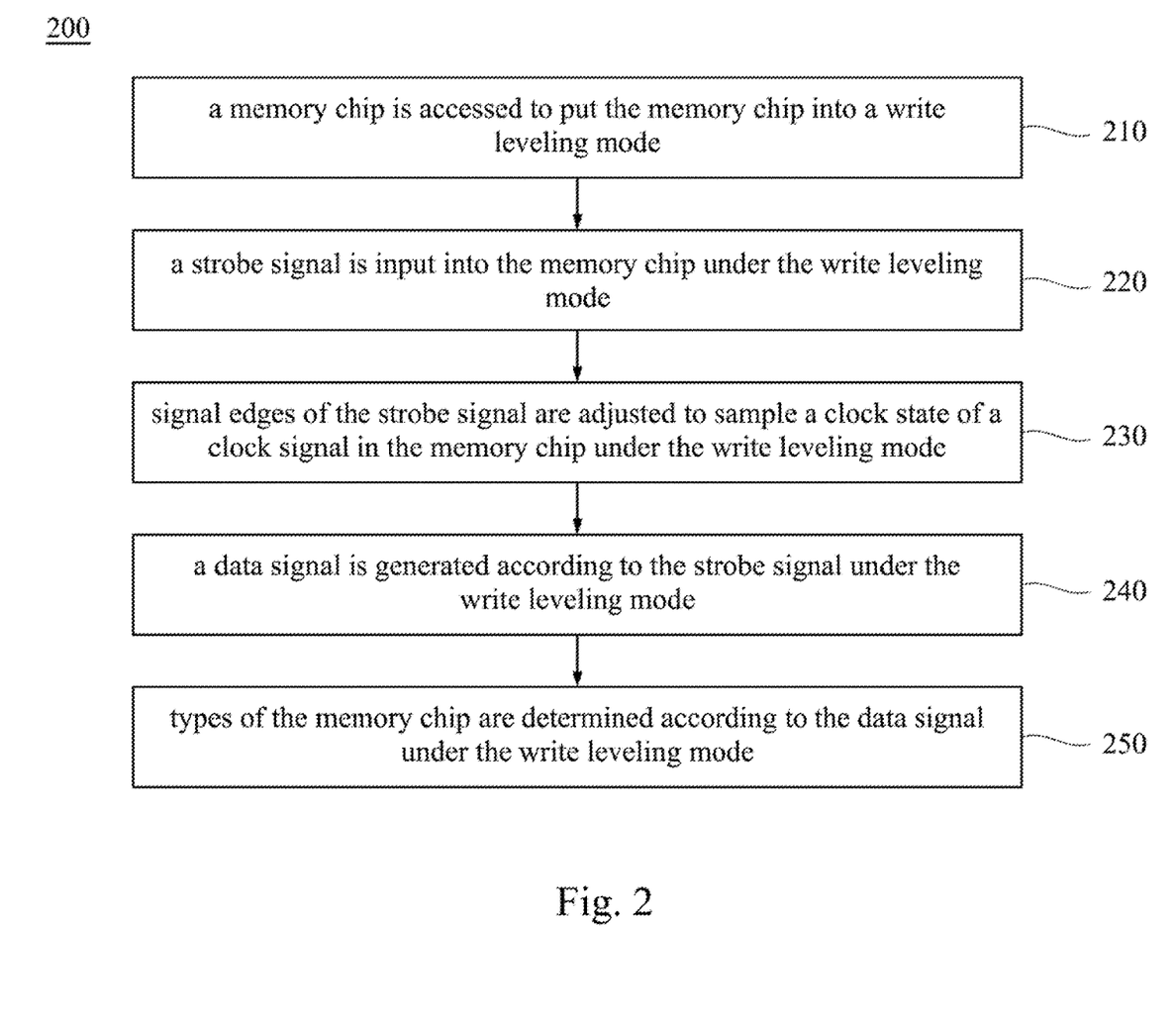
FIG. 2 depicts a flow chart of a testing method according to one embodiment of the present disclosure.
Figure 3:
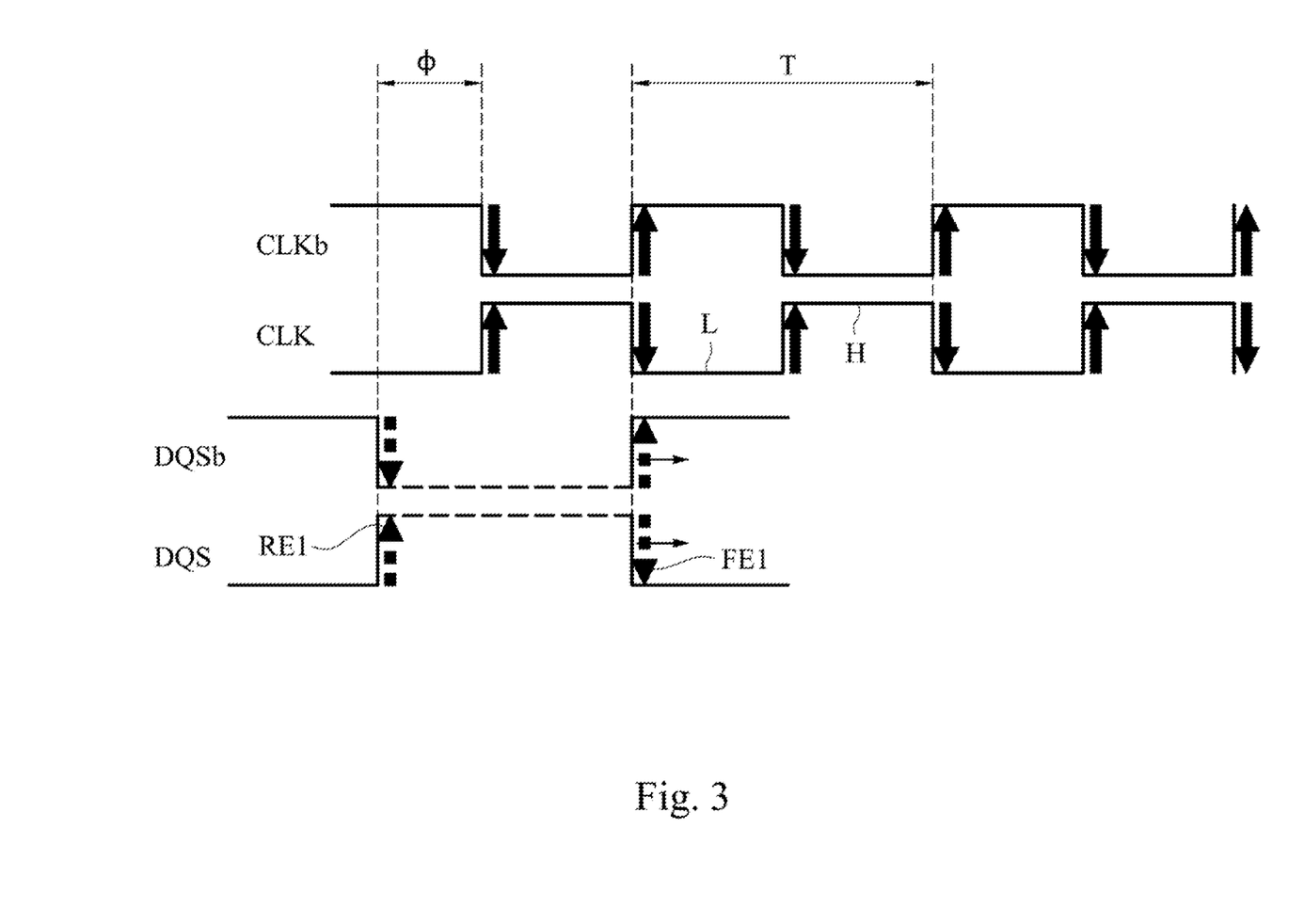
FIG. 3 depicts a timing diagram of signals of a testing system according to one embodiment of the present disclosure.

In some embodiments, in order to facilitate the understanding of a testing system 100 shown in FIG. 1. Please refer to FIG. 1 to FIG. 6B. FIG. 2 depicts a flow chart of a testing method 200 according to one embodiment of the present disclosure. FIG. 3 and FIG. 5 depict timing diagrams of signals of the testing system 100 according to one embodiment of the present disclosure. FIGS. 4A~4B, and FIGS. 6A~6B depict shmoo graphs of signals of the testing system 100 according to one embodiment of the present disclosure. In some embodiments, the testing method 200 for includes step 210 to step 250, which will be described as shown below.

In step 210, a memory chip is accessed to put the memory chip into a write leveling mode. In some embodiments, please refer to FIG. 1 and FIG. 2, each of the memory chip 111 and the memory chip 112 is accessed to put the memory chip 111 and the memory chip 112 into a write leveling mode by the memory controller 120 of the testing system 100.

It should be note that a purpose of the write leveling mode of the memory chip is to use every block in a memory chip equally to avoid some specific blocks from becoming corrupted blocks due to overusing the specific blocks so as to prolong a service life of the memory chip.

In step 220, a strobe signal is input into the memory chip under the write leveling mode. In some embodiments, please refer to FIG. 1 and FIG. 2, a strobe signal DQS is input into the memory chip 111 or the memory chip 112 under the write leveling mode by the memory controller 120 of the testing system 100.

In step 230, signal edges of the strobe signal are adjusted to sample a clock state of a clock signal in the memory chip under the write leveling mode. In some embodiments, please refer to FIG. 1 to FIG. 3, signal edges of the strobe signal DQS are adjusted to sample a clock state of a clock signal CLK in each of the memory chip 111 and the memory chip 112 under the write leveling mode by the memory controller 120 of the testing system 100.

In some embodiments, please refer to FIG. 3, the reverse clock signal CLKb is a reverse signal of the clock signal CLK. The reverse strobe signal DQSb is a reverse signal of the strobe signal DQS. It should be noted that a phase shift Φ (or called a delay) is formed between the clock signal CLK and the strobe signal DQS.

In some embodiments, please refer to FIG. 3, a ratio of a first duty circle H of a high voltage level to a second duty circle L of a low voltage level of the clock signal CLK is not equal to one. The first duty circle H and the second duty circle L form a complete duty circle T of the clock signal CLK.

In some embodiments, please refer to FIG. 1 and FIG. 3, a ratio of the duty circle of a high voltage level H to the duty circle of a low voltage level L of the clock signal CLK can be adjusted by the memory controller 120.

In some embodiments, please refer to FIG. 1 and FIG. 3, and focus on the clock signal CLK and the strobe signal DQS, the memory controller 120 is further configured to fix a rising edge RE1 of the strobe signal DQS, and move a falling edge FE1 of the strobe signal DQS to sample the clock state of the clock signal CLK so as to detect a first change of the data signal DQ and a second change of the data signal DQ.

In some embodiments, the memory controller 120 is further configured to move a falling edge FE1 of the strobe signal DQS to sample the clock signal CLK for at least one complete duty circle T of the clock signal CLK.

In some embodiments, please refer to FIG. 1 and FIG. 5, and focus on the clock signal CLK and the strobe signal DQS, the memory controller 120 is further configured to fix a falling edge FE2 of the strobe signal DQS, and move a rising edge RE2 of the strobe signal DQS to sample the clock state of the clock signal CLK so as to detect a first change of the data signal DQ and a second change of the data signal DQ.

In some embodiments, the memory controller 120 is further configured to move a rising edge RE2 of the strobe signal DQS to sample the clock signal CLK for at least one complete duty circle T of the clock signal CLK.

In step 240, a data signal is generated according to the strobe signal under the write leveling mode. In some embodiments, please refer to FIG. 1 and FIG. 2, the data signal DQ is generated according to the strobe signal DQS by each of the memory chip 111 and the memory chip 112 under the write leveling mode.

In some embodiments, each of the memory chip 111 and the memory chip 112 is further configured to latch the data signal DQ if one of the first change of the data signal DQ and the second change of the data signal DQ is detected.

In some embodiments, please refer to FIG. 1, FIG. 3, and FIGS. 4A-4B, when the memory controller 120 is further configured to move the falling edge FE1 of the strobe signal DQS to sample the clock signal CLK, the falling edge FE1 of the strobe signal DQS samples a falling edge of the clock signal CLK first so as to make each of the memory chip 111 and the memory chip 112 generate the first change of the data signal DQ.

Then, when the memory controller 120 is further configured to keep moving the falling edge FE1 of the strobe signal DQS to sample the clock signal CLK, the falling edge FE1 of the strobe signal DQS samples a rising edge of the clock signal CLK so as to make each of the memory chip 111 and the memory chip 112 generate the second change of the data signal DQ.

In some embodiments, the memory controller 120 is configured to latch the data signal DQ if one of the first change of the data signal DQ and the second change of the data signal DQ is detected.

Figure 4A:
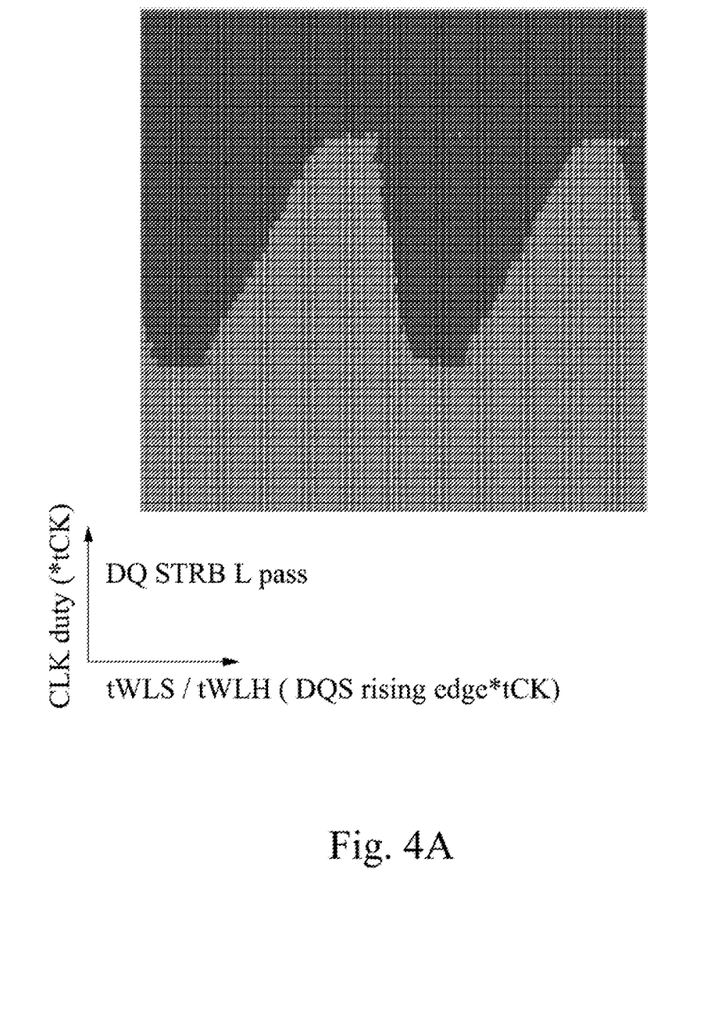
FIG. 4A depicts a shmoo graph of signals of a testing system according to one embodiment of the present disclosure.

In some embodiments, please refer to FIG. 1, FIG. 3, and FIGS. 4A-4B, the memory controller 120 is configured to generate a first shmoo graph shown in FIG. 4A according to the first change of the data signal DQ.

Figure 4B:
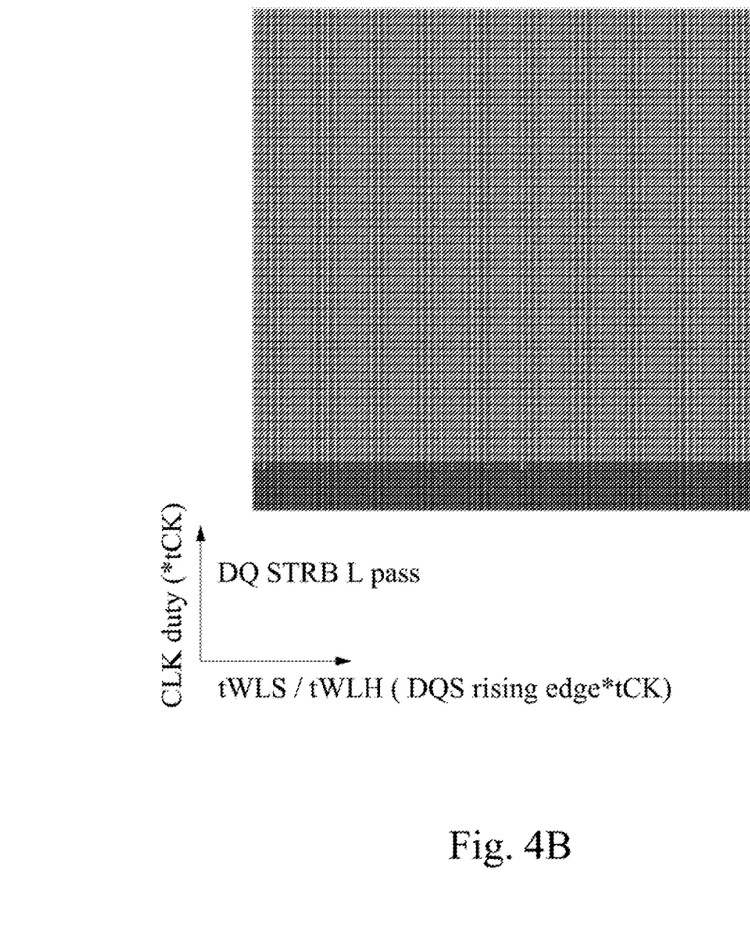
FIG. 4B depicts a shmoo graph of signals of a testing system according to one embodiment of the present disclosure.
Figure 5:
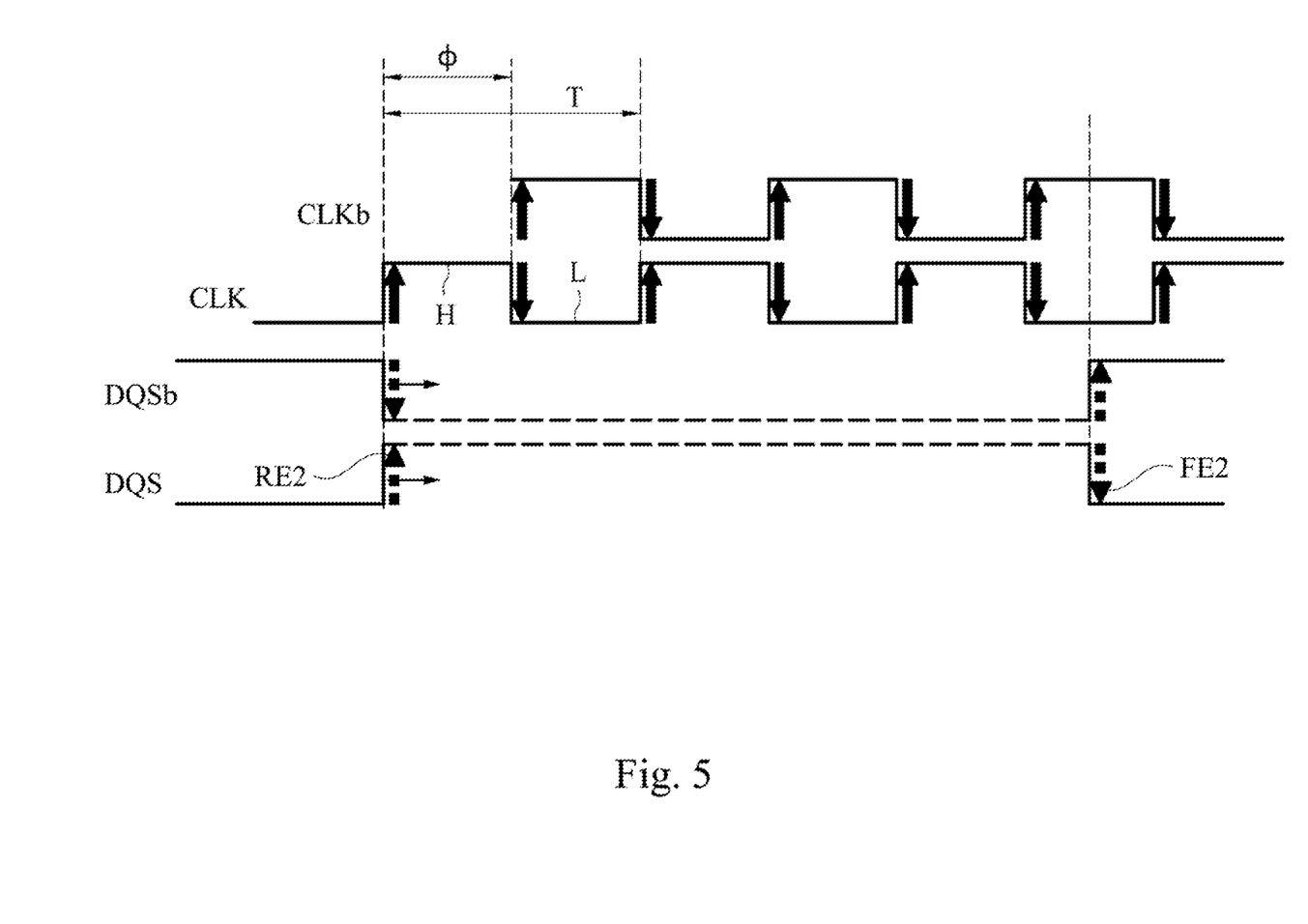
FIG. 5 depicts a timing diagram of signals of a testing system according to one embodiment of the present disclosure.

In some embodiments, the memory controller 120 is configured to generate a second shmoo graph shown in FIG. 4B according to the second change of the data signal DQ. It should be noted that a vertical axis of each of the shmoo graph shown in FIGS. 4A-4B is a duty circle of a clock signal CLK(or called an absolute clock period tCK), and a unit of the duty circle of the clock signal is a nanosecond (ns). A horizontal axis is a ratio of two write leveling timing parameters (tWLS/tWLH).

In some embodiments, please refer to FIG. 1, FIG. 5, and FIGS. 6A-6B, when the memory controller 120 is further configured to move the rising edge RE2 of the strobe signal DQS to sample the clock signal CLK, the rising edge RE2 of the strobe signal DQS samples a rising edge of the clock signal CLK first so as to make each of the memory chip 111 and the memory chip 112 generate the first change of the data signal DQ.

Then, when the memory controller 120 is further configured to keep moving the rising edge RE2 of the strobe signal DQS to sample the clock signal CLK, the rising edge RE2 of the strobe signal DQS samples a falling edge of the clock signal CLK so as to make each of the memory chip 111 and the memory chip 112 generate the second change of the data signal DQ.

In some embodiments, the memory controller 120 is configured to latch the data signal DQ if one of the first change of the data signal DQ and the second change of the data signal DQ is detected.

Figure 6A:
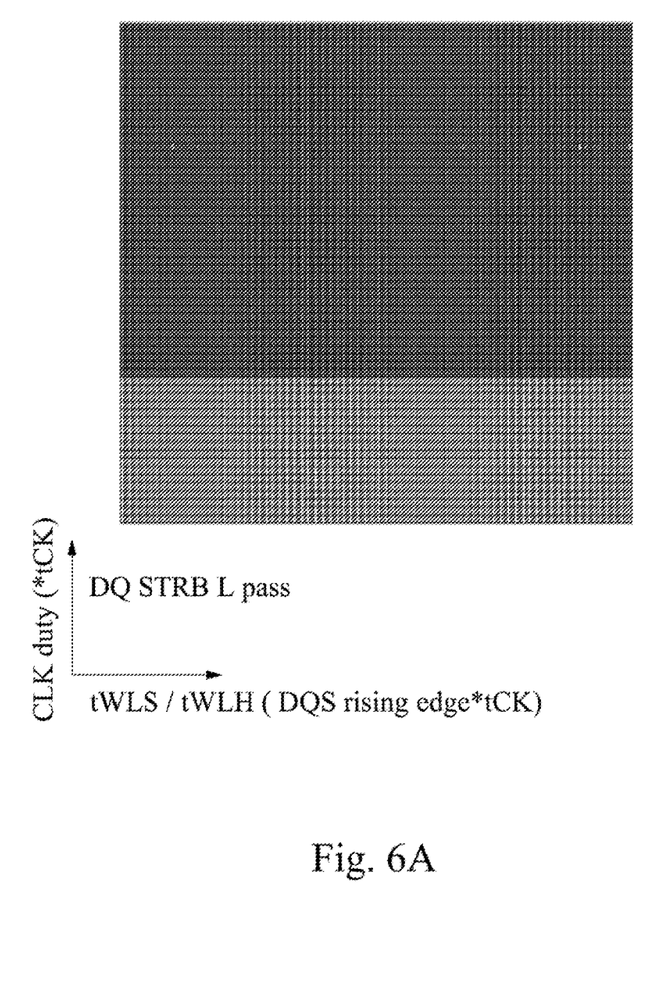
FIG. 6A depicts a shmoo graph of signals of a testing system according to one embodiment of the present disclosure.

In some embodiments, please refer to FIG. 1, FIG. 5, and FIGS. 6A-6B, the memory controller 120 is configured to generate a first shmoo graph shown in FIG. 6A according to the first change of the data signal DQ.

Figure 6B:
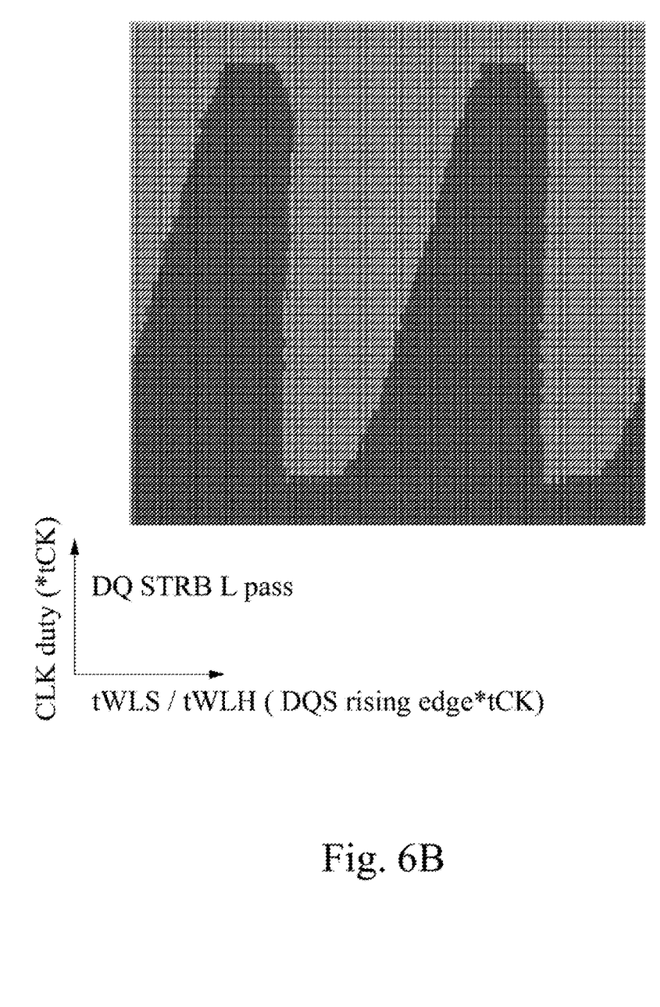
FIG. 6B depicts a shmoo graph of signals of a testing system according to one embodiment of the present disclosure.

In some embodiments, the memory controller 120 is configured to generate a second shmoo graph shown in FIG. 6B according to the second change of the data signal DQ. It should be noted that a vertical axis of each of the shmoo graph shown in FIGS. 6A-6B is a duty circle of a clock signal CLK(or called an absolute clock period tCK), and a unit of the duty circle of the clock signal CLK is a nanosecond (ns). A horizontal axis is a ratio of two write leveling timing parameters (tWLS/tWLH).

In step 250, types of the memory chip are determined according to the data signal under the write leveling mode. In some embodiments, please refer to FIG. 1 and FIG. 2, types of each of the memory chip 111 and the memory chip 112 are determined according to the data signal DQ under the write leveling mode by the memory controller 120 of the testing system 100.

In some embodiments, please refer to FIG. 1, and FIGS. 4A-4B, the memory controller 120 is further configured to determine a first type of each of the memory chip 111 and the memory chip 112 is that the clock state of the clock signal CLK is changed with the falling edge of the strobe signal DQS if the first change of the data signal DQ is detected shown in FIG. 4A.

In some embodiments, please refer to FIG. 1, and FIGS. 6A-6B, the memory controller 120 is further configured to determine a second type of each of the memory chip 111 and the memory chip 112 is that the clock state of the clock signal CLK is changed with the rising edge of the strobe signal DQS if the second change of the data signal DQ is detected shown in FIG. 6B.

Based on the above embodiments, the present disclosure provides a testing system and a testing method to adjust duty circles of a clock signal and signal edges of the strobe signal of a memory so as to investigate two kinds of memories to improve a write leveling mode of a memory.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A testing method, comprising:
   accessing a memory chip to put the memory chip into a write leveling mode;
   inputting a strobe signal into the memory chip under the write leveling mode;
   adjusting signal edges of the strobe signal to sample a clock state of a clock signal in the memory chip under the write leveling mode;
   generating a data signal according to the strobe signal under the write leveling mode; and
   determining types of the memory chip according to the data signal under the write leveling mode.

2. The testing method of claim 1, wherein a ratio of a first duty circle of a high voltage level to a second duty circle of a low voltage level of the clock signal is not equal to one.

3. The testing method of claim 2, wherein adjusting the signal edges of the strobe signal to sample the clock state of the clock signal in the memory chip under the write leveling mode comprises:
   fixing a rising edge of the strobe signal; and
   moving a falling edge of the strobe signal to sample the clock state of the clock signal so as to detect a first change of the data signal and a second change of the data signal.

4. The testing method of claim 2, wherein adjusting the signal edges of the strobe signal to sample the clock state of the clock signal in the memory chip under the write leveling mode comprises:
   fixing a falling edge of the strobe signal; and
   moving a rising edge of the strobe signal to sample the clock state of the clock signal so as to detect a first change of the data signal and a second change of the data signal.

5. The testing method of claim 3, wherein generating the data signal according to the strobe signal under the write leveling mode comprises:
   latching the data signal if one of the first change of the data signal and the second change of the data signal is detected.

6. The testing method of claim 5, wherein determining types of the memory chip according to the data signal under the write leveling mode comprises:
   generating two shmoo graphs according to the first change of the data signal, the second change of the data signal, and the strobe signal.

7. The testing method of claim 6, wherein determining the types of the memory chip according to the data signal under the write leveling mode comprises:
   determining a first type of the memory chip is that the clock state of the clock signal is changed with the falling edge of the strobe signal if the first change of the data signal is detected.

8. The testing method of claim 7, wherein determining types of the memory chip according to the data signal under the write leveling mode comprises:
   determining a second type of the memory chip is that the clock state of the clock signal is changed with the rising edge of the strobe signal if the second change of the data signal is detected.

9. The testing method of claim 1, further comprising:
   compensating the memory chip according to the types of the memory chip under the write leveling mode.

10. The testing method of claim 9, wherein compensating the memory chip according to the types of the memory chip under the write leveling mode comprises:
    adjusting a delay of the strobe signal relative to the clock signal under the write leveling mode.

11. A testing system, comprising:
    a memory chip; and
    a memory controller, coupled to the memory chip, and configured to access the memory chip to put the memory chip into a write leveling mode, wherein the memory controller is configured to input a strobe signal into the memory chip under the write leveling mode, wherein the memory controller is configured to adjust signal edges of the strobe signal to sample a clock state of a clock signal in the memory chip under the write leveling mode, wherein the memory chip is configured to generate a data signal according to the strobe signal under the write leveling mode, wherein the memory controller is configured to determine types of the memory chip according to the data signal under the write leveling mode.

12. The testing system of claim 11, wherein a ratio of a first duty circle of a high voltage level to a second duty circle of a low voltage level of the clock signal is not equal to one.

13. The testing system of claim 12, wherein the memory controller is further configured to fix a rising edge of the strobe signal and move a falling edge of the strobe signal to sample the clock state of the clock signal so as to detect a first change of the data signal and a second change of the data signal.

14. The testing system of claim 12, wherein the memory controller is further configured to fix a falling edge of the strobe signal and move a rising edge of the strobe signal to sample the clock state of the clock signal so as to detect a first change of the data signal and a second change of the data signal.

15. The testing system of claim 13, wherein the memory chip is further configured to latch the data signal if one of the first change of the data signal and the second change of the data signal is detected.

16. The testing system of claim 15, wherein the memory controller is configured to generate two shmoo graphs according to the first change of the data signal, the second change of the data signal, and the strobe signal.

17. The testing system of claim 16, wherein the memory controller is further configured to determine a first type of the memory chip is that the clock state of the clock signal is changed with the falling edge of the strobe signal if the first change of the data signal is detected.

18. The testing system of claim 17, wherein the memory controller is further configured to determine a second type of the memory chip is that the clock state of the clock signal is changed with the rising edge of the strobe signal if the second change of the data signal is detected.

19. The testing system of claim 11, wherein the memory controller is further configured to compensate the memory chip according to the types of the memory chip under the write leveling mode.

20. The testing system of claim 19, wherein the memory controller is further configured to adjust a delay of the strobe signal relative to the clock signal under the write leveling mode.

* * * * *